(12) United States Patent
Zheng et al.

(10) Patent No.: US 9,455,782 B2
(45) Date of Patent: Sep. 27, 2016

(54) MONITORING A MULTIPLEXED LASER ARRAY IN AN OPTICAL COMMUNICATION SYSTEM

(71) Applicant: Applied Optoelectronics, Inc., Sugar Land, TX (US)

(72) Inventors: Jun Zheng, Missouri City, TX (US); Yi Wang, Katy, TX (US); I-Lung Ho, Sugar Land, TX (US); Klaus Alexander Anselm, Sugar Land, TX (US); Huanlin Zhang, Sugar Land, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 0 days.

(21) Appl. No.: 14/456,124

(22) Filed: Aug. 11, 2014

(65) Prior Publication Data

US 2016/0043799 A1  Feb. 11, 2016

(51) Int. Cl.
*H04B 10/04* (2006.01)
*H04B 10/079* (2013.01)
*H01S 5/40* (2006.01)
*H01S 5/0683* (2006.01)
*H04J 14/02* (2006.01)
*H04B 10/40* (2013.01)
*H04B 10/50* (2013.01)

(52) U.S. Cl.
CPC ....... *H04B 10/07955* (2013.01); *H01S 5/0683* (2013.01); *H01S 5/4025* (2013.01); *H04B 10/40* (2013.01); *H04B 10/503* (2013.01); *H04J 14/02* (2013.01)

(58) Field of Classification Search
CPC .................. H04B 10/5057; H04B 10/50572; H04B 10/50575; H04B 10/50577; H04B 10/5059; H04B 10/506; H01S 5/0683; H01S 5/0014

USPC ....... 398/192, 193, 194, 195, 196, 197, 198, 398/199, 200, 201, 33, 38, 30, 31, 32, 79, 398/158, 159; 372/29.02, 29.01, 29.021, 372/38.02
See application file for complete search history.

(56) References Cited

U.S. PATENT DOCUMENTS

| | | | | |
|---|---|---|---|---|
| 5,920,414 | A * | 7/1999 | Miyachi | H04B 10/506 398/14 |
| 8,126,332 | B2 * | 2/2012 | Bainbridge et al. | 398/95 |
| 8,306,419 | B2 * | 11/2012 | Luk et al. | 398/32 |
| 8,971,362 | B2 * | 3/2015 | Smith et al. | 372/29.021 |
| 2005/0286909 | A1 * | 12/2005 | Kish et al. | 398/196 |

(Continued)

*Primary Examiner* — Hanh Phan
(74) *Attorney, Agent, or Firm* — Grossman Tucker Perreault & Pfleger, PLLC; Norman S. Kinsella (57) ABSTRACT

Individual channels of a multiplexed laser array in a multi-channel optical transmitter are monitored at an output of an optical multiplexer. The monitoring may be used to confirm proper operation of each of the channels in the multiplexed laser array and/or to perform wavelength locking on each of the channels. Monitoring at the output of the optical multiplexer avoids the use of multiple photodetectors coupled directly to multiple lasers in the multiplexed laser array. The multiplexed laser array generally includes a plurality of laser emitters optically coupled to an optical multiplexer such as an arrayed waveguide grating (AWG). An optical transmitter with a monitored multiplexed laser array may be used, for example, in an optical line terminal (OLT) in a wavelength division multiplexed (WDM) passive optical network (PON) or in any other type of WDM optical communication system capable of transmitting optical signals on multiple channel wavelengths.

16 Claims, 5 Drawing Sheets

(56) References Cited

U.S. PATENT DOCUMENTS

| | | |
|---|---|---|
| 2013/0016971 A1 | 1/2013 | Zheng et al. |
| 2013/0016977 A1 | 1/2013 | Zheng et al. |
| 2013/0188951 A1 | 7/2013 | Zheng et al. |
| 2013/0223844 A1 | 8/2013 | Hwang |

* cited by examiner

MONITORING A MULTIPLEXED LASER ARRAY IN AN OPTICAL COMMUNICATION SYSTEM

TECHNICAL FIELD

The present invention relates to monitoring lasers in optical communication systems and more particularly, to monitoring individual channels in a multiplexed laser array at an output of an optical multiplexer.

BACKGROUND INFORMATION

Fiber optic communications networks may increase the amount of information carried on an optical fiber by multiplexing different optical signals on different wavelengths using wavelength division multiplexing (WDM). In a WDM passive optical network (PON), for example, a trunk fiber carries optical signals at multiple channel wavelengths to and from an optical branching point and the branching point provides a simple routing function by directing signals of different wavelengths to and from individual subscribers. In this case, each subscriber may be assigned one or more of the channel wavelengths on which to send and/or receive data.

To transmit and receive optical signals over multiple channel wavelengths, an optical line terminal (OLT) in a WDM-PON may include a multi-channel transmitter optical subassembly (TOSA) and a multi-channel receiver optical subassembly (ROSA). One example of a TOSA includes a multiplexed laser array that combines multiple optical signals at multiple channel wavelengths. In laser transmitters, the lasers may be monitored to determine that the lasers are operating with the desired power and at the desired wavelength. Monitoring lasers in laser transmitters has involved a photodetector coupled to each of the lasers. In multiplexed laser arrays, however, it may not be feasible to couple a photodetector to each of the lasers, for example, within the limited space of a multi-channel TOSA. The photodectors directly coupled to the multiplexed lasers also may not accurately monitor the wavelength of the light after passing through the optical multiplexer.

BRIEF DESCRIPTION OF THE DRAWINGS

These and other features and advantages will be better understood by reading the following detailed description, taken together with the drawings wherein.

DETAILED DESCRIPTION

Individual channels of a multiplexed laser array in a multi-channel optical transmitter are monitored, consistent with embodiments of the present disclosure, at an output of an optical multiplexer. The monitoring may be used to confirm proper operation of each of the channels in the multiplexed laser array and/or to perform wavelength locking on each of the channels. Monitoring at the output of the optical multiplexer avoids the use of multiple photodetectors coupled directly to multiple lasers in the multiplexed laser array. The multiplexed laser array generally includes a plurality of laser emitters optically coupled to an optical multiplexer such as an arrayed waveguide grating (AWG). An optical transmitter with a monitored multiplexed laser array may be used, for example, in an optical line terminal (OLT) in a wavelength division multiplexed (WDM) passive optical network (PON) or in any other type of WDM optical communication system capable of transmitting optical signals on multiple channel wavelengths.

As used herein, "laser emitter" refers to any device that causes, either alone or together with other components, lasing and the emission of laser light at one or more wavelengths. A laser emitter may include, without limitation, a discrete laser, such as a distributed feedback (DFB) laser or a Fabry-perot (FP) laser, or a laser component, such as a gain region or a gain chip, that forms an external cavity laser with other components. As used herein, "channel wavelengths" refer to the wavelengths associated with optical channels and may include a specified wavelength band around a center wavelength. In one example, the channel wavelengths may be defined by an International Telecommunication (ITU) standard such as the ITU-T dense wavelength division multiplexing (DWDM) grid. As used herein, "tuning to a channel wavelength" refers to adjusting a laser output such that the emitted laser light includes the channel wavelength. The term "coupled" as used herein refers to any connection, coupling, link or the like by which signals carried by one system element are imparted to the "coupled" element and "optically coupled" refers to coupling such that light is imparted from one element to another element. Such "coupled" devices are not necessarily directly connected to one another and may be separated by intermediate components or devices that may manipulate or modify such signals.

Figure 1:
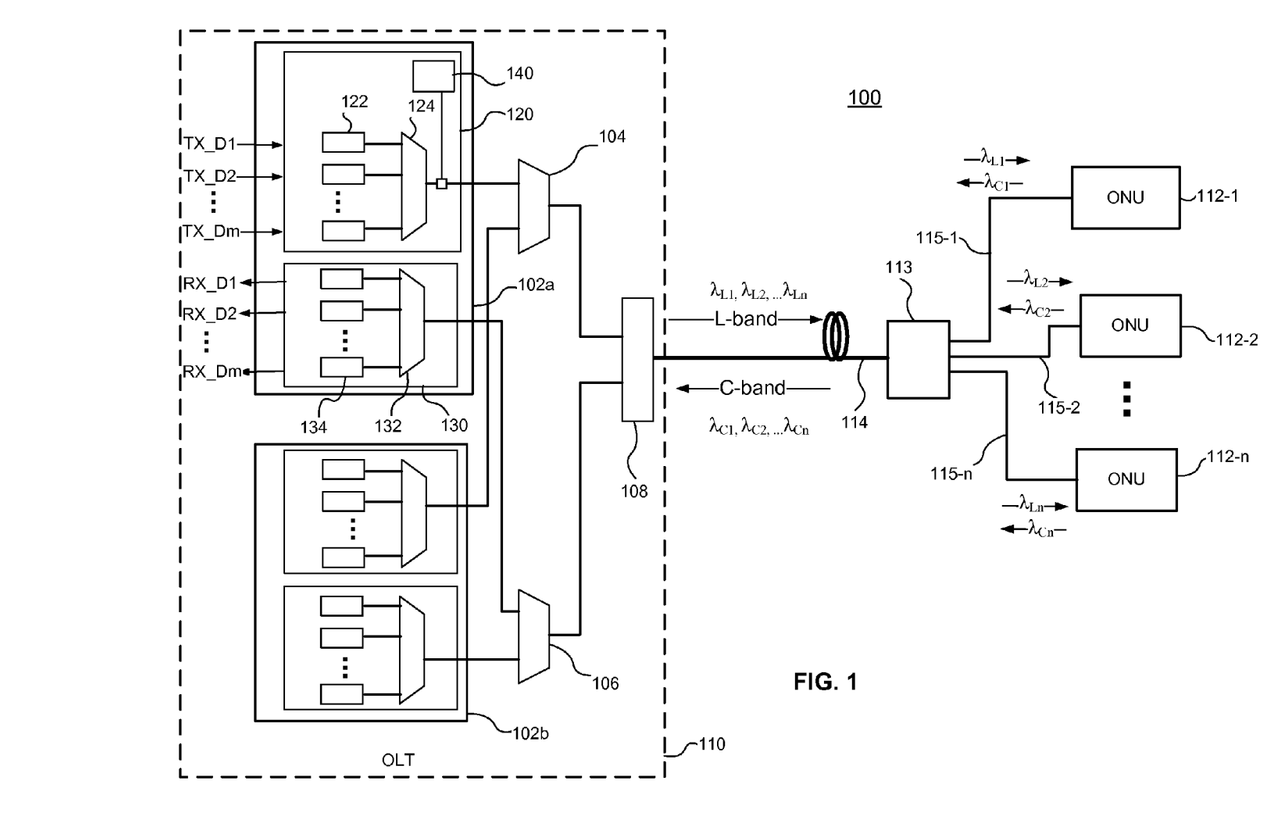
FIG. 1 is a functional block diagram of a wavelength division multiplexed (WDM) passive optical network (PON) including an optical line terminal (OLT) with at least one multiplexed laser array that is monitored, consistent with embodiments of the present disclosure.

A multiplexed laser array that is monitored consistent with embodiments of the present disclosure may be used, for example, in a WDM-PON 100 including one or more multi-channel optical transceivers 102a, 102b, as shown in FIG. 1. The WDM-PON 100 provides a point-to-multipoint optical network architecture using a WDM system. According to one embodiment of the WDM-PON 100, at least one optical line terminal (OLT) 110 may be coupled to a plurality of optical networking terminals (ONTs) or optical networking units (ONUs) 112-1 to 112-*n* via optical fibers, waveguides, and/or paths 114, 115-1 to 115-*n*. Although the OLT 110 includes two multi-channel optical transceivers 102*a*, 102*b* in the illustrated embodiment, the OLT 110 may include one or more multi-channel optical transceivers.

The OLT 110 may be located at a central office of the WDM-PON 100, and the ONUs 112-1 to 112-*n* may be located in homes, businesses or other types of subscriber location or premises. A branching point 113 (e.g., a remote node) couples a trunk optical path 114 to the separate optical paths 115-1 to 115-*n* to the ONUs 112-1 to 112-*n* at the respective subscriber locations. The branching point 113 may include one or more passive coupling devices such as a splitter or optical multiplexer/demultiplexer. In one example, the ONUs 112-1 to 112-*n* may be located about 20 km or less from the OLT 110.

The WDM-PON 100 may also include additional nodes or network devices, such as Ethernet PON (EPON) or Gigabit PON (GPON) nodes or devices, coupled between the branching point 113 and ONUs 112-1 to 112-*n* at different locations or premises. One application of the WDM-PON 100 is to provide fiber-to-the-home (FTTH) or fiber-to-the-premises (FTTP) capable of delivering voice, data, and/or video services across a common platform. In this application, the central office may be coupled to one or more sources or networks providing the voice, data and/or video.

In the WDM-PON 100, different ONUs 112-1 to 112-*n* may be assigned different channel wavelengths for transmitting and receiving optical signals. In one embodiment, the WDM-PON 100 may use different wavelength bands for transmission of downstream and upstream optical signals relative to the OLT 110 to avoid interference between the received signal and back reflected transmission signal on the same fiber. For example, the L-band (e.g., about 1565 to 1625 nm) may be used for downstream transmissions from the OLT 110 and the C-band (e.g., about 1530 to 1565 nm) may be used for upstream transmissions to the OLT 110. The upstream and/or downstream channel wavelengths may generally correspond to the ITU grid. In one example, the upstream wavelengths may be aligned with the 100 GHz ITU grid and the downstream wavelengths may be slightly offset from the 100 GHz ITU grid.

The ONUs 112-1 to 112-*n* may thus be assigned different channel wavelengths within the L-band and within the C-band. Transceivers or receivers located within the ONUs 112-1 to 112-*n* may be configured to receive an optical signal on at least one channel wavelength in the L-band (e.g., $\lambda_{L1}$, $\lambda_{L2}$, ... $\lambda_{Ln}$). Transceivers or transmitters located within the ONUs 112-1 to 112-*n* may be configured to transmit an optical signal on at least one channel wavelength in the C-band (e.g., $\lambda_{C1}$, $\lambda_{C2}$, ... $\lambda_{Cn}$). Other wavelengths and wavelength bands are also within the scope of the system and method described herein.

The branching point 113 may demultiplex a downstream WDM optical signal (e.g., $\lambda_{L1}$, $\lambda_{L2}$, ... $\lambda_{Ln}$) from the OLT 110 for transmission of the separate channel wavelengths to the respective ONUs 112-1 to 112-*n*. Alternatively, the branching point 113 may provide the downstream WDM optical signal to each of the ONUs 112-1 to 112-*n* and each of the ONUs 112-1 to 112-*n* separates and processes the assigned optical channel wavelength. The individual optical signals may be encrypted to prevent eavesdropping on optical channels not assigned to a particular ONU. The branching point 113 also combines or multiplexes the upstream optical signals from the respective ONUs 112-1 to 112-*n* for transmission as an upstream WDM optical signal (e.g., $\lambda_{C1}$, $\lambda_{C2}$, ... $\lambda_{Cn}$) over the trunk optical path 114 to the OLT 110.

The OLT 110 may be configured to generate multiple optical signals at different channel wavelengths (e.g., $\lambda_{L1}$, $\lambda_{L2}$, ... $\lambda_{Ln}$) and to combine the optical signals into the downstream WDM optical signal carried on the trunk optical fiber or path 114. Each of the OLT multi-channel optical transceivers 102*a*, 102*b* may include a multi-channel transmitter optical subassembly (TOSA) 120 for generating and combining the optical signals at the multiple channel wavelengths. The OLT 110 may also be configured to separate optical signals at different channel wavelengths (e.g., $\lambda_{C1}$, $\lambda_{C2}$, ... $\lambda_{Cn}$) from an upstream WDM optical signal carried on the trunk path 114 and to receive the separated optical signals. Each of the OLT multi-channel optical transceivers 102*a*, 102*b* may thus include a multi-channel receiver optical subassembly (ROSA) 130 for separating and receiving the optical signals at multiple channel wavelengths.

One embodiment of the multi-channel TOSA 120 includes an array of laser emitters 122, such as laser diodes, which may be modulated by respective RF data signals (TX_D1 to TX_Dm) to generate the respective optical signals. The laser emitters 122 may be modulated using various modulation techniques including external modulation and direct modulation. An optical multiplexer 124, such as an arrayed waveguide grating (AWG), combines the optical signals at the different respective downstream channel wavelengths (e.g., $\lambda_{L1}$, $\lambda_{L2}$, ... $\lambda_{Lm}$). The laser emitters 122 and the optical multiplexer 124 together form a multiplexed laser array. In the illustrated embodiment, the OLT 110 further includes a multiplexer 104 for multiplexing the multiplexed optical signal from the multi-channel TOSA 120 in the multi-channel transceiver 102*a* with a multiplexed optical signal from a multi-channel TOSA in the other multi-channel transceiver 102*b* to produce the downstream aggregate WDM optical signal.

In some embodiments, the laser emitters 122 may be tunable lasers that generate the optical signals at the respective channel wavelengths. In other embodiments, the laser emitters 122 may generate optical signals over a band of channel wavelengths and filtering and/or multiplexing techniques may be used to produce the assigned channel wavelengths. In further embodiments, the laser emitters 122 may include gain chips that form external laser cavities, for example, with waveguides in the optical multiplexer 124. Examples of multiplexed laser arrays that may be used in multi-channel optical transmitters are disclosed in greater detail in U.S. patent application Ser. No. 13/543,310 (U.S. Patent Application Pub. No. 2013-0016971), U.S. patent application Ser. No. 13/357,130 (U.S. Patent Application Pub. No. 2013-0016977), U.S. patent application Ser. No. 13/595,505 (U.S. Patent Application Pub. No. 2013-0223844), and U.S. patent application Ser. No. 13/357,142 (U.S. Patent Application Pub. No. 20130188951), all of which are fully incorporated herein by reference.

A monitoring system 140 is optically coupled to an output of the optical multiplexer 124 for monitoring each of the channels, as will be described in greater detail below. When the laser emitters 122 are tunable lasers, the TOSA 120 may also include a wavelength tuning system (not shown), such as a temperature control system, for tuning each of the laser emitters 122 to a channel wavelength in response to the monitoring at the output of the optical multiplexer (i.e., wavelength locking). One example of a temperature control system for use in a multi-channel transmitter is described in greater detail in U.S. patent application Ser. No. 13/774,125

(U.S. Patent Application Pub. No. 20140241726), which is fully incorporated herein by reference.

One embodiment of the multi-channel ROSA 130 includes a demultiplexer 132 for separating the respective upstream channel wavelengths (e.g., $\lambda_{C1}, \lambda_{C2}, \ldots \lambda_{Cn}$). An array of photodetectors 134, such as photodiodes, detects the optical signals at the respective separated upstream channel wavelengths and provides the received data signals (RX_D1 to RX_Dm). In the illustrated embodiment, the OLT 110 further includes a demultiplexer 106 for demultiplexing the upstream WDM optical signal into first and second WDM optical signals provided to the respective multi-channel ROSA in each of the transceivers 102a, 102b. The OLT 110 also includes a diplexer 108 between the trunk path 114 and the multiplexer 104 and the demultiplexer 106 such that the trunk path 114 carries both the upstream and the downstream channel wavelengths. The transceivers 102a, 102b may also include other components, such as laser drivers, transimpedance amplifiers (TIAs), and control interfaces, used for transmitting and receiving optical signals.

In one example, each of the multi-channel optical transceivers 102a, 102b may be configured to transmit and receive 16 channels such that the WDM-PON 100 supports 32 downstream L-band channel wavelengths and 32 upstream C-band channel wavelengths. One example of the WDM-PON 100 may operate at 1.25 Gbaud using on-off keying as the modulation scheme. Other data rates and modulation schemes may also be used.

As mentioned above, the upstream and downstream channel wavelengths may span a range of channel wavelengths on the 100 GHz ITU grid. Each of the transceivers 102a, 102b, for example, may cover 16 channel wavelengths in the L-band for the TOSA and 16 channel wavelengths in the C-band for the ROSA such that the transceivers 102a, 102b together cover 32 channels. Thus, the multiplexer 104 may combine 16 channels from one transceiver 102a with 16 channels from the other transceiver 102b, and the demultiplexer 106 may separate a 32 channel WDM optical signal into two 16 channel WDM optical signals. To facilitate use of the multiplexer 104 and the demultiplexer 106, the range of channel wavelengths may skip channels in the middle of the range. According to one example of a multi-channel optical transceiver used in the WDM-PON 100, the desired wavelength precision or accuracy is ±0.05 nm and the desired operating temperature is between −5 and 70° C.

Figures 2, 2A:
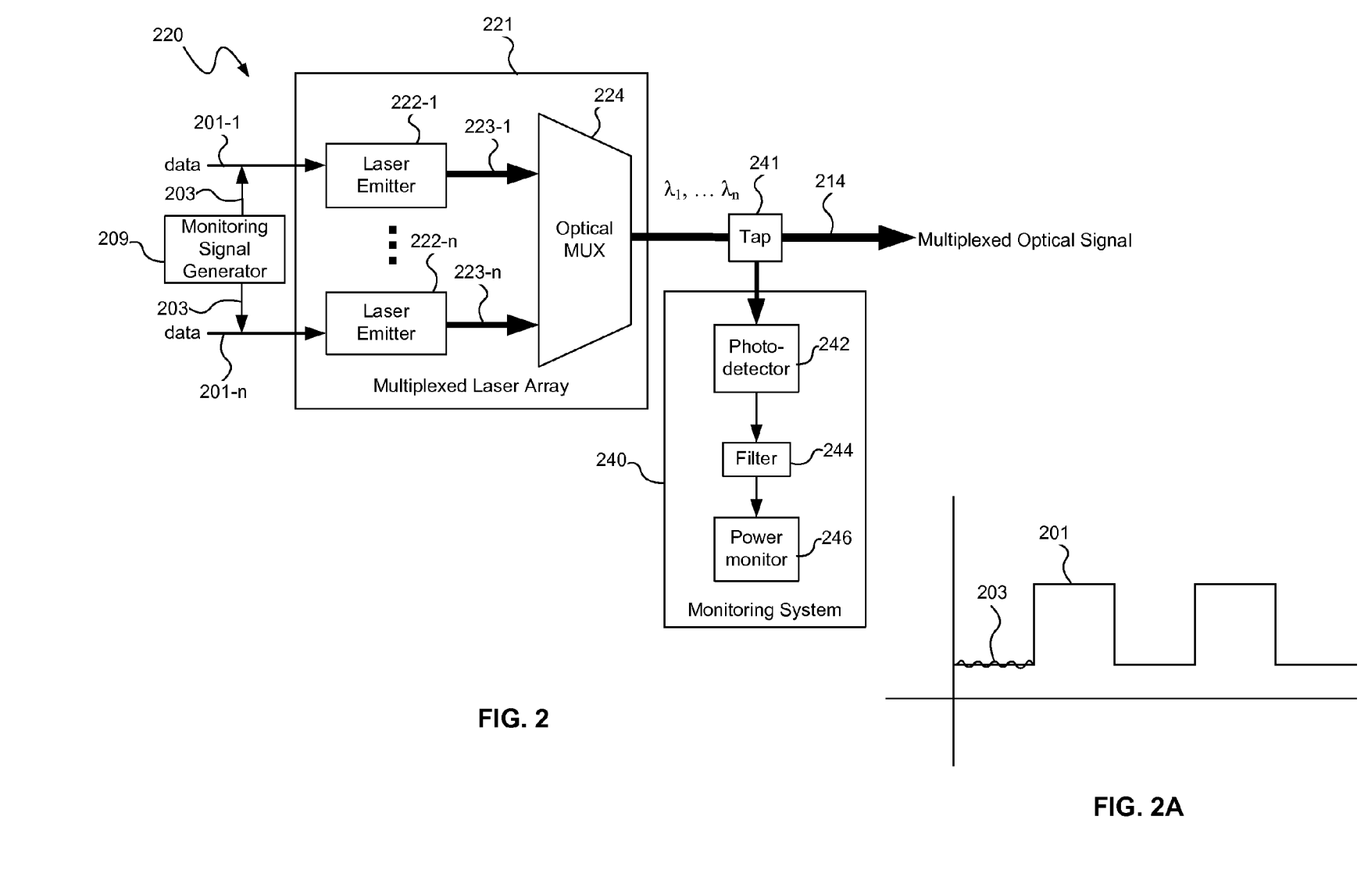
FIG. 2 is a functional block diagram of a multiplexed laser array with monitoring at an output of an optical multiplexer, consistent with embodiments of the present disclosure.
FIG. 2A is a graph illustrating a data signal together with a monitoring signal, consistent with embodiments of the present disclosure.

Referring to FIGS. 2 and 2A, an embodiment of a multi-channel optical transmitter 220 with monitoring at an output of a multiplexed laser array 221 is described in greater detail. The multiplexed laser array 221 includes a plurality of laser emitters 222-1 to 222-n associated with a plurality of channels 1 to n and optically coupled to optical inputs of an optical multiplexer 224. Each of the laser emitters 222-1 to 222-n has electrical inputs that receive data signals 201-1 to 201-n and optical outputs that provide modulated optical signals 223-1 to 223-n. The optical multiplexer 224 combines the optical signals 223-1 to 223-n at different channel wavelengths and provides a wavelength division multiplexed optical signal 214. The optical multiplexer 224 may be an AWG or other multiplexing arrangement such as thin film filters.

The multi-channel optical transmitter 220 also includes a monitoring system 240 optically coupled to an output of the optical multiplexer 224, for example, using an optical tap 241. The optical tap 241 may tap 1% of the optical signal. The monitoring system 240 thus receives and monitors the tapped portion of the multiplexed optical signal 214 to monitor each of the channels in the multiplexed laser array 221. The monitoring system 240 may confirm, for example, that each of the laser emitters 222-1 to 222-n are properly transmitting by extracting and monitoring a signal originating from respective laser emitters 222-1 to 222-n.

A monitoring signal generator 209 provides a monitoring signal 203 to one or more of the electrical inputs of the laser emitters 222-1 to 222-n together with the data signals 201-1 to 201-n. The monitoring signal 203 has characteristics that allow the monitoring signal to be sent with the data signals 201-1 to 201-n without substantial interference with the data signals 201-1 to 201-n and that allow the monitoring signal to be separated from the multiplexed optical signal 214 at the output of the optical multiplexer 224. As shown in FIG. 2A, for example, the monitoring signal 203 may have an amplitude and/or frequency that is lower than the amplitude and/or frequency of the data signal 201. The monitoring signal may have a frequency, for example, in a range of 1 to 100 kHz and an amplitude in a range of 0.1 to 1 mA. FIG. 2A merely shows a schematic representation of the data signal 201 and the monitoring signal 203 to illustrate the difference in the amplitude and frequency and does not necessarily represent the actual signals in a system during operation. For example, the monitoring signal 203 may have a sinusoidal waveform, as shown, or other waveforms. In one example, the monitoring signal 203 may have a frequency of 1 kHz and an amplitude of 0.1 mA, whereas the data signal 201 may have a frequency of 1.25 GHz (i.e., a data rate of 1.25 GBs) and an amplitude of 30 mA.

The monitoring system 240 detects and separates the monitoring signal from the multiplexed optical signal 214 and then monitors the power of the monitoring signal. In the illustrated embodiment, the monitoring system 240 includes a photodetector 242 such as a photodiode, a filter 244 such as a low-pass or bandpass filter, and a power monitor 246. The photodetector 242 detects the portion of the multiplexed optical signal 214 tapped from the output of the optical multiplexer 224. The filter 244 filters the detected portion of the multiplexed optical signal to obtain the monitoring signal, and the power monitor 246 may then measure the power level of the detected monitoring signal.

In some embodiments, the monitoring signal 203 may be provided for a predefined period of time to each of the laser emitters 222-1 to 222-n consecutively. The monitoring of the multiplexed laser array 221 may thus be conducted by "sweeping" across all of the channels and evaluating the monitoring signal from each of the laser emitters 222-1 to 222-n. In other embodiments, the monitoring signal 203 may be provided to multiple laser emitters 222-1 to 222-n simultaneously. The same monitoring signal 203 may be applied to each of the laser emitters 222-1 to 222-n or a different monitoring signal 203 may be applied to different ones of the laser emitters 222-1 to 222-n. Each of the laser emitters 222-1 to 222-n, for example, may be modulated with a monitoring signal having a different frequency, thereby allowing multiple laser emitters 222-1 to 222-n to be monitored simultaneously. In this example, multiple filters 244 may be used to obtain each of the monitoring signals at the different frequencies.

The monitoring may be performed continuously or periodically while the optical transmitter operates. Although the monitoring system is capable of monitoring while the multiplexed laser array is transmitting optical data signals, the monitoring system may also be performed without transmitting optical data signals, for example, when testing an optical transmitter at start up.

Figures 3, 3A:
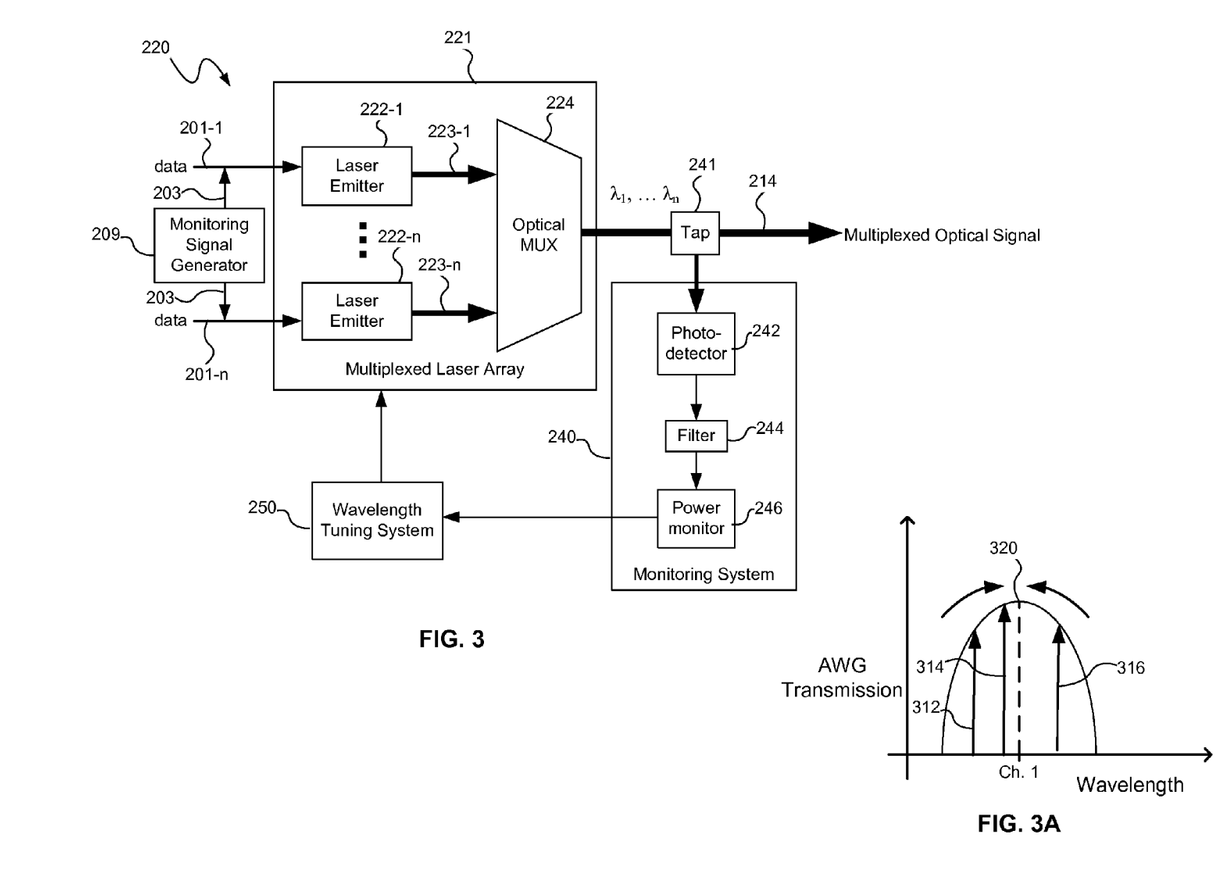
FIG. 3 is a functional block diagram of a multiplexed laser array with monitoring at an output of an optical multiplexer and wavelength locking, consistent with other embodiments of the present disclosure.
FIG. 3A is a graph illustrating the transmission spectrum of a channel of an optical multiplexer and wavelength locking at that channel, consistent with embodiments of the present disclosure.

Referring to FIGS. 3 and 3A, the monitoring system 240 may also be used with a wavelength tuning system 250 to provide wavelength locking for each of the channel wavelengths in the multiplexed laser array 221. The wavelength locking may be performed continuously during operation of the multi-channel optical transmitter 220 or may be performed periodically to tune the laser emitters 222-1 to 222-n that have drifted over time. The wavelength locking may be performed for each of the laser emitters 222-1 to 222-n in sequence or simultaneously.

In this embodiment, each of the laser emitters 222-1 to 222-n is tunable to a channel wavelength (or range of wavelengths including the channel wavelength) associated with the laser emitter and the optical multiplexer 224 filters the modulated optical signals 223-1 to 223-n output from the laser emitters 222-1 to 222-n at each of the channel wavelengths. If one of the laser emitters 222-1 to 222-n is not tuned to the appropriate wavelength or range of wavelengths, the relative strength of the optical signal from that laser emitter will be reduced when that optical signal is filtered by the optical multiplexer 224. Thus, the relative strength of a monitoring signal originating from one of the laser emitters 222-1 to 222-n may be monitored at an output of the optical multiplexer 224 to determine if that laser emitter is tuned to the appropriate wavelength or range of wavelengths. The wavelength tuning system 250 may tune the laser emitters 222-1 to 222-n to the appropriate channel wavelengths in response to the power level of the monitoring signal measured by the monitoring system 240.

FIG. 3A shows one example of the transmission spectrum for a channel of an optical multiplexer 224 such as an AWG. As illustrated, the transmission spectrum in this example has a Gaussian profile and the power of the monitoring signal is maximized when the laser emitter emitting the monitoring signal is tuned to the associated channel wavelength (e.g., $Ch_1$). As the laser emitter drifts from the associated channel wavelength, the power of the monitoring signal is reduced at the output of the optical multiplexer 224 because the optical multiplexer 224 filters at the associated channel wavelength. For example, a monitored power level 312, 314, 316 less than the maximum power level for the channel indicates that the laser emitter has drifted relative to the associated channel wavelength of the optical multiplexer. As illustrated, the laser emitter may be tuned to dither the wavelength until the monitored power level approaches the maximum power level 320. The power level of the monitoring signals at the output of the optical multiplexer 224 may thus be used as feedback to the wavelength tuning system 250 for locking each of the laser emitters 222-1 to 222-n at the respective channel wavelengths.

In some embodiments, the laser emitters 222-1 to 222-n may include thermally tunable lasers such as DFB lasers and the wavelength tuning system 250 may include a temperature control system for thermally tuning the laser emitters 222-1 to 222-n. A temperature control system may include, for example, heaters (not shown) located proximate each of the laser emitters 222-1 to 222-n and one or more thermoelectric coolers (not shown) thermally coupled to the laser emitters 222-1 to 222-n. In one example of the wavelength tuning system 250 using thermal tuning, the laser emitters 222-1 to 222-n may be thermally tuned to the channel wavelengths by establishing a global temperature for the array of laser emitters and separately raising local temperatures of individual laser emitters in response to the monitored power of the monitoring signals associated with the laser emitters. A temperature control device, such as a TEC cooler coupled to the laser array, may provide the global temperature, and individual heaters, such as resistors adjacent respective lasers, may provide the local temperatures. This type of wavelength tuning system is described in greater detail in U.S. patent application Ser. No. 13/774,125 (U.S. Patent Application Pub. No. 20140241726), which is fully incorporated herein by reference.

Figure 4:
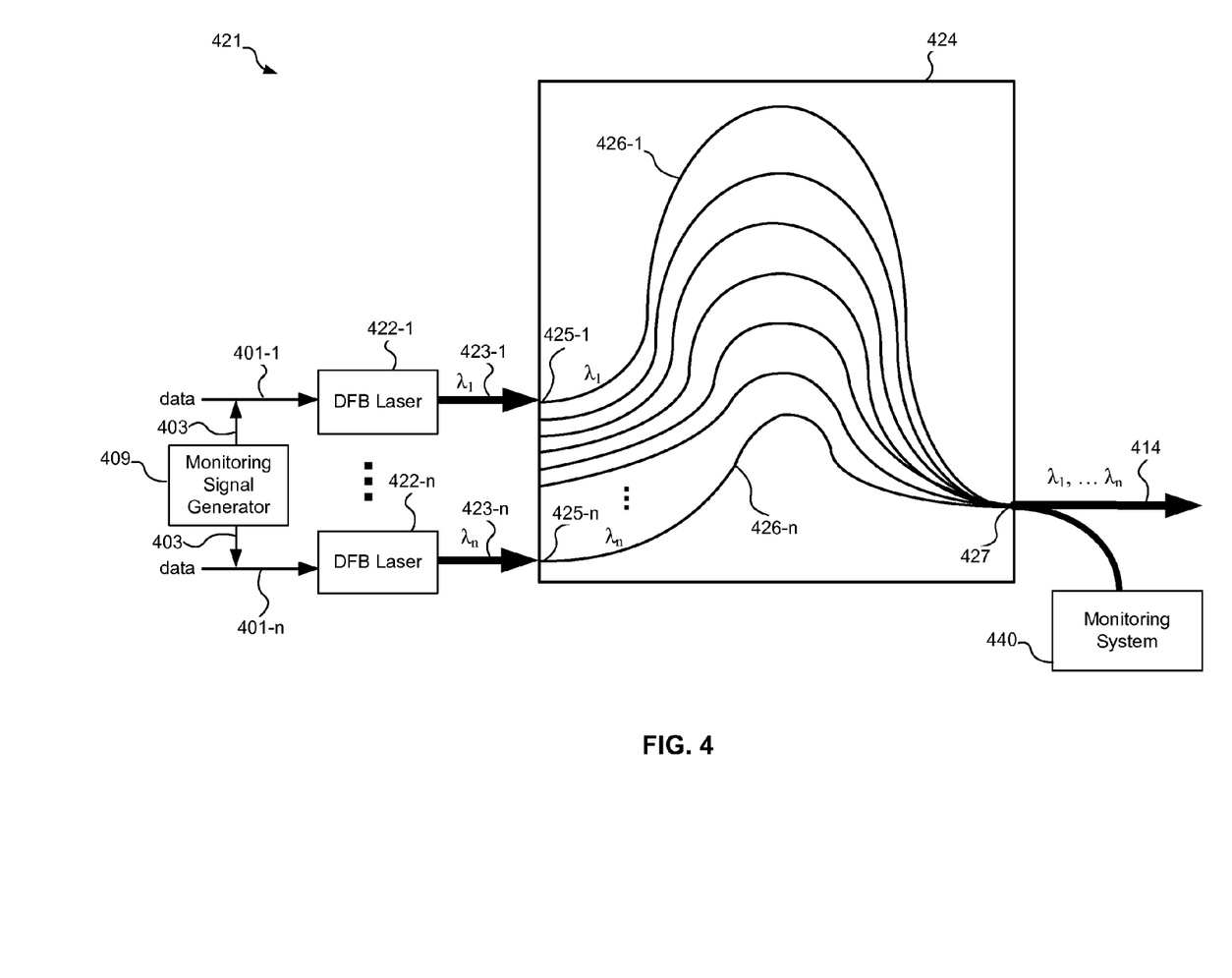
FIG. 4 is a schematic diagram of a multiplexed laser array including DFB lasers coupled to an arrayed waveguide grating (AWG), consistent with an embodiment of the present disclosure.

FIG. 4 shows one embodiment of a multiplexed laser array 421 that may be monitored at an output as described above. The multiplexed laser array 421 includes a plurality of DFB lasers 422-1 to 422-n optically coupled to an AWG 424. The DFB lasers 422-1 to 422-n may emit light at the respective channel wavelengths or at ranges of wavelengths including the respective channel wavelengths. The DFB lasers 422-1 to 422-n may be tunable, for example, in response to temperature changes. Although the illustrated embodiment includes DFB lasers, multiplexed laser array 421 may also include a plurality of FP lasers that emit light across a broad range of wavelengths including multiple channel wavelengths. The AWG 424 may thus provide both channel wavelength selection and the multiplexing.

The AWG 424 includes an array of waveguides 426-1 to 426-n coupled between input ports 425-1 to 425-n and an output port 427. The AWG 424 may include existing AWGs that provide the desired channel wavelengths on the respective waveguides 426-1 to 426-n, effectively filtering the light passing through the AWG 424. Modulated optical signals 423-1 to 423-n output from each of the DFB lasers 422-1 to 422-n are optically coupled to the respective input ports 425-1 to 425-n. The AWG 424 filters the light at different channel wavelengths for each of the input ports 425-1 to 425-n such that the light passes through each of the waveguides 426-1 to 426-n at the different channel wavelengths associated with the respective DFB lasers 422-1 to 422-n. The AWG 424 then combines the selected channel wavelengths on the output port 427 and outputs a multiplexed optical signal 414.

The AWG 424 may be a dense WDM (DWDM) AWG with at least sixteen (16) AWG inputs and waveguides for sixteen (16) channels, although other AWG configurations with other numbers of channels are within the scope of the present disclosure. Although the example embodiment shows an AWG, the WDM system may also include other types of optical multiplexers capable of filtering light at different channel wavelengths associated with different respective input ports of the optical multiplexer. Also, multiple AWGs may be used to provide the channel wavelength selection.

A monitoring system 440 is optically coupled at the output port 427 of the AWG 424 for monitoring each of the DFB lasers 422-1 to 422-n, as described above. A monitoring signal generator 409, as described above, generates the monitoring signal(s) 403 provided to electrical inputs of one or more of the DFB lasers 422-1 to 422-n together with the data signals 401-1 to 401-n. The monitoring system 440 extracts and monitors the monitoring signal(s) 403 at the output of the optical multiplexer 424 to monitor the gain region(s) 422-1 to 422-n that emitted the monitoring signal. A wavelength tuning system (not shown) may also be used for tuning each of the DFB lasers 422-1 to 422-n in response to the relative strength of the monitoring signals measured by the monitoring system 440, as described above.

Figures 5, 6, 7:
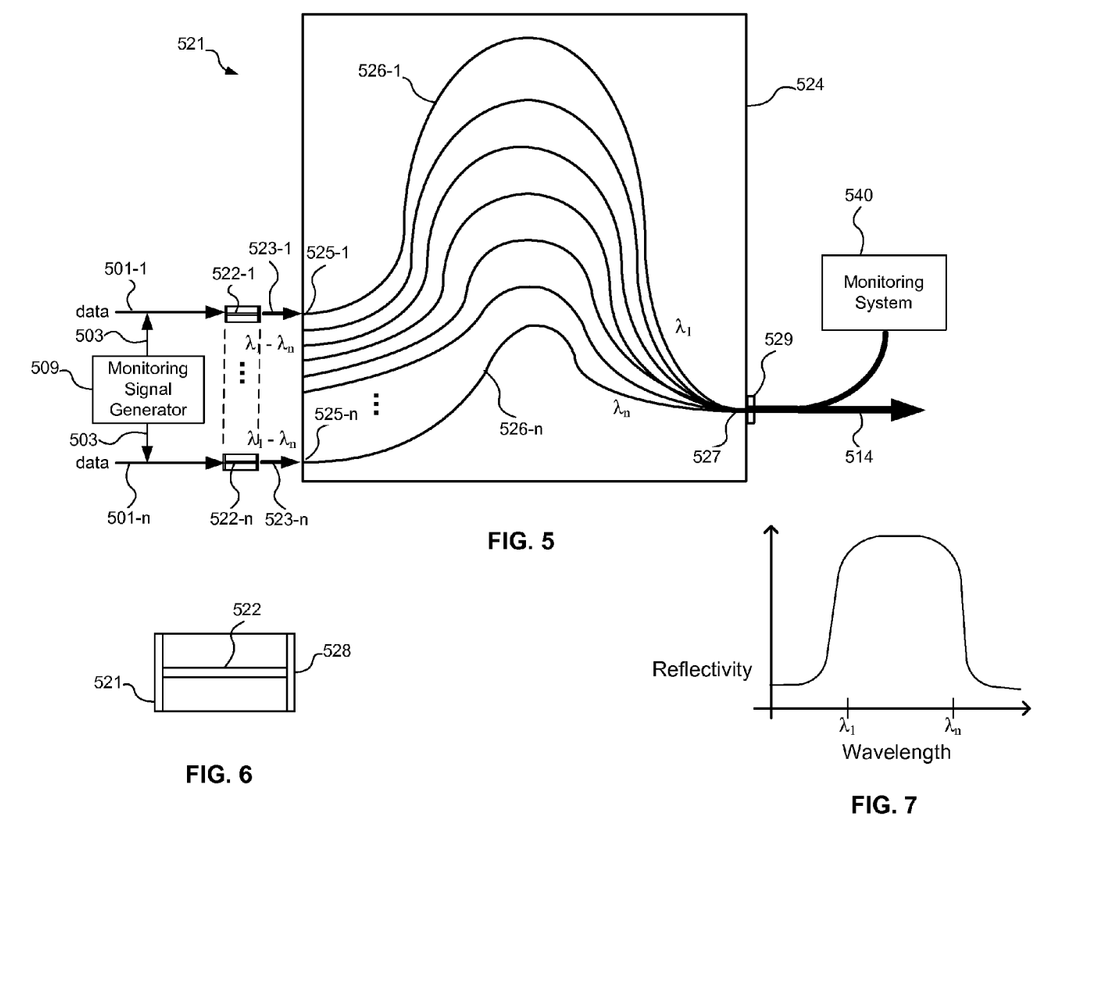
FIG. 5 is a schematic diagram of a multiplexed laser array including an array of FP laser gain chips coupled to an arrayed waveguide grating (AWG), consistent with another embodiment of the present disclosure.
FIG. 6 is a schematic diagram of an FP laser gain chip that may be used in the multiplexed laser array shown in FIG. 5.
FIG. 7 is a graph illustrating the reflectivity characteristics of a fiber Bragg grating that may be used as the exit reflector in the multiplexed laser array shown in FIG. 5.

FIG. 5 shows another embodiment of a multiplexed laser array 521 that may be monitored at an output as described above. In this embodiment, the multiplexed laser array 521 includes an array of gain regions 522-1 to 522-n optically coupled to an AWG 524 forming external laser cavities using the waveguides within the AWG 524. The gain regions 522-1 to 522-n emit and amplify light across a range of wavelengths including multiple channel wavelengths (e.g., $\lambda_1$ to $\lambda_n$). The AWG 524 provides filtering at the respective individual channel wavelengths and reflects the filtered light back to the gain regions 522-1 to 522-n such that lasing occurs at the respective individual channel wavelengths in the external lasing cavities formed in the AWG 524.

Each of the gain regions 522-1 to 522-n may include multiple quantum-well active regions or other gain media capable of emitting a spectrum of light across a range of wavelengths including the channel wavelengths (e.g., $\lambda_1$ to $\lambda_n$) and capable of amplifying light reflected back into the gain media. The gain regions 522-1 to 522-n may be located, for example, in a Fabry-Perot gain chip designed for use with an external cavity laser. The gain regions 522-1 to 522-n may be, for example, a plurality of individual gain chips or an array of gain regions formed on one chip.

As shown in greater detail in FIG. 6, a back reflector 521 is provided on a back side of each gain region 522 and an anti-reflective coating 528 is provided on an opposite side that is optically coupled to the AWG 524. The back reflector 521 reflects light (e.g., at the channel wavelength) from the gain region 522 and the anti-reflective coating 528 allows light to pass into and out of the gain region 522. The back reflector 521 may be highly reflective (e.g., at least 80% reflective) and may include a cleaved facet on a laser or gain chip, a reflective coating on the chip, or a distributed Bragg reflector (DBR) on the gain chip or separate from the gain chip. The anti-reflective coating 528 may have a reflectivity as small as possible (e.g., less than 1% reflective).

The AWG 524 includes an array of waveguides 526-1 to 526-n optically coupled between input ports 525-1 to 525-n and an output port 527. Modulated optical signals 523-1 to 523-n output from each of the gain regions 522-1 to 522-n at the range of channel wavelengths (e.g., $\lambda_1$ to $\lambda_n$) are optically coupled into the respective input ports 525-1 to 525-n of the AWG 524. Each of the waveguides 526-1 to 526-n filter the light from the respective gain regions 522-1 to 522-n at a different channel wavelength such that the emitted light from each of the gain regions 522-1 to 522-n passes through the AWG 524 at those filtered channel wavelengths (e.g., $\lambda_1, \lambda_2, \ldots \lambda_n$). Thus, the different channel wavelengths (e.g., $\lambda_1, \lambda_2, \ldots \lambda_n$) are associated with the respective input ports 525-1 to 525-n of the AWG 524 and with respective gain regions 522-1 to 522-n coupled to those input ports.

A exit reflector 529 located at the output port 527 of the AWG 524 reflects at least a portion of the filtered light back through the AWG 524 and into the respective gain regions 522-1 to 522-n. Thus, the exit reflector 529 completes a plurality of lasing cavities formed between the back reflector 521 of each of the respective gain regions 522-1 to 522-n and the exit reflector 529. The gain regions 522-1 to 522-n amplify the reflected light at the respective channel wavelengths to provide the gain that results in lasing when the gain exceeds the cavity losses. When lasing occurs at each of the associated channel wavelengths ($\lambda_1, \lambda_2 \ldots \lambda_n$), the combined optical signals 523-1 to 523-n at the respective channel wavelengths ($\lambda_1, \lambda_2 \ldots \lambda_n$) pass through the exit reflector 529, thereby producing a WDM optical signal 514.

The exit reflector 529 may be coupled to an optical fiber (not shown) using a lens (not shown) for carrying the multiplexed optical signal 514. The exit reflector 529 may have partial reflectivity across the channel wavelengths ($\lambda_1$ to $\lambda_n$), as shown in FIG. 7, which is sufficient to achieve lasing at those wavelengths. When the multiplexed laser array is used in an OLT of a WDM-PON as shown in FIG. 1, for example, the exit reflector 529 may provide about 50% reflectivity across wavelengths in the L band. The exit reflector 529 may include, for example, a partially reflective coating, a thin film reflector, or a fiber grating (e.g., a 50% fiber Bragg grating). When the exit reflector 529 is a fiber grating, a single port V-groove block (not shown) may be used to align the fiber grating with the AWG output port 527 and the optical fiber. Although the illustrated embodiment shows an exit reflector 529 at the output port 527 of the AWG 524, other embodiments may include exit reflectors (e.g., Bragg gratings) located within the waveguides of the AWG.

The gain regions 522-1 to 522-n may be coupled to the input ports 525-1 to 525-n, for example, using a microlens array or using an optically matched laser array coupling assembly, such as a fiber tip array, as disclosed in greater detail in U.S. Patent Application Pub. No. 2013/0188951 entitled OPTICALLY MATCHED LASER ARRAY COUPLING ASSEMBLY FOR COUPLING LASER ARRAY TO ARRAYED WAVEGUIDE GRATING, which is fully incorporated herein by reference.

A monitoring system 540 is optically coupled at the output port 527 of the AWG 524 for monitoring each of the gain regions 522-1 to 522-n, as described above. A monitoring signal generator 509, as described above, generates the monitoring signal(s) 503 provided to electrical inputs of one or more of the gain regions 522-1 to 522-n together with the data signals 501-1 to 501-n. The monitoring system 540 extracts and monitors the monitoring signal(s) 503 at the output of the optical multiplexer 524 to monitor the gain region(s) 522-1 to 522-n that emitted the monitoring signal.

Accordingly, a multiplexed laser array may be monitored, consistent with embodiments of the present disclosure, by monitoring an output of an optical multiplexer, thereby avoiding the need for multiple photodetectors coupled to each of the laser emitters in the multiplexed laser array.

Consistent with one embodiment, a multi-channel optical transmitter includes a plurality of laser emitters having electrical inputs for receiving electrical signals including data signals and optical outputs for outputting modulated optical signals and an optical multiplexer including a plurality of input ports optically coupled to the optical outputs of the laser emitters, respectively. Each of the laser emitters is associated with a channel and a channel wavelength. The optical multiplexer is configured to receive the modulated optical signals from the laser emitters and to produce a multiplexed optical signal including the modulated optical signals at a plurality of different channel wavelengths, respectively. The multi-channel optical transmitter also includes a monitoring signal generator coupled to the electrical inputs of the laser emitters. The monitoring signal generator being configured to generate at least one monitoring signal and to provide the at least one monitoring signal to an electrical input of at least one of the laser emitters. The multi-channel optical transmitter further includes a monitoring system optically coupled to an output of the optical multiplexer. The monitoring system is configured to obtain the monitoring signal from the multiplexed optical signal and to monitor a power level of the monitoring signal.

Consistent with another embodiment, a method is provided for monitoring a multiplexed laser array. The method includes: modulating a plurality of channels of the multiplexed laser array with respective data signals and multiplexing to produce a multiplexed optical data signal at an output of the multiplexed laser array; modulating at least one channel of the multiplexed laser array with a monitoring signal to produce a monitoring optical signal together with the multiplexed optical data signal at the output the multiplexed laser array, wherein the monitoring signal has a lower amplitude and frequency than the data signals; and monitoring at least a portion of the monitoring optical signal at the output of the multiplexed laser array to determine a power of the monitoring signal.

Consistent with a further embodiment, a multi-channel optical transceiver module includes a transceiver housing, a multi-channel receiver optical sub-assembly (ROSA) located in the transceiver housing and configured to receive a wavelength division multiplexed (WDM) optical signal on multiple channel wavelengths, and a multi-channel transmitter optical sub-assembly (TOSA) located in the transceiver housing and configured to transmit a wavelength division multiplexed (WDM) optical signal on multiple channel wavelengths. The TOSA includes a plurality of laser emitters having electrical inputs for receiving electrical signals including data signals and optical outputs for outputting modulated optical signals and an optical multiplexer including a plurality of input ports optically coupled to the optical outputs of the laser emitters, respectively. Each of the laser emitters is associated with a channel and a channel wavelength. The optical multiplexer is configured to receive the modulated optical signals from the laser emitters and to produce a multiplexed optical signal including the modulated optical signals at a plurality of different channel wavelengths, respectively. The multi-channel optical transmitter also includes a monitoring signal generator coupled to the electrical inputs of the laser emitters. The monitoring signal generator being configured to generate at least one monitoring signal and to provide the at least one monitoring signal to an electrical input of at least one of the laser emitters. The multi-channel optical transmitter further includes a monitoring system optically coupled to an output of the optical multiplexer. The monitoring system is configured to obtain the monitoring signal from the multiplexed optical signal and to monitor a power level of the monitoring signal.

Consistent with yet another embodiment, a wavelength division multiplexed (WDM) system includes a plurality of terminals configured to transmit and receive optical signals on multiple channel wavelengths. At least one of the plurality of terminals includes a plurality of laser emitters having electrical inputs for receiving electrical signals including data signals and optical outputs for outputting modulated optical signals and an optical multiplexer including a plurality of input ports optically coupled to the optical outputs of the laser emitters, respectively. Each of the laser emitters is associated with a channel and a channel wavelength. The optical multiplexer is configured to receive the modulated optical signals from the laser emitters and to produce a multiplexed optical signal including the modulated optical signals at a plurality of different channel wavelengths, respectively. The multi-channel optical transmitter also includes a monitoring signal generator coupled to the electrical inputs of the laser emitters. The monitoring signal generator being configured to generate at least one monitoring signal and to provide the at least one monitoring signal to an electrical input of at least one of the laser emitters. The multi-channel optical transmitter further includes a monitoring system optically coupled to an output of the optical multiplexer. The monitoring system is configured to obtain the monitoring signal from the multiplexed optical signal and to monitor a power level of the monitoring signal.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A multi-channel optical transmitter comprising:
   a plurality of laser emitters having electrical inputs for receiving electrical signals including data signals and optical outputs for outputting modulated optical signals, wherein each of the laser emitters is associated with a channel and a channel wavelength;
   an optical multiplexer including a plurality of input ports optically coupled to the optical outputs of the laser emitters, respectively, the optical multiplexer being configured to receive the modulated optical signals from the laser emitters and to produce a multiplexed optical signal including the modulated optical signals at a plurality of different channel wavelengths, respectively;
   a monitoring signal generator coupled to the electrical inputs of the laser emitters, the monitoring signal generator being configured to generate a monitoring signal and to provide the monitoring signal to the electrical input of one of the laser emitters, wherein the monitoring signal generator is configured to provide the monitoring signal to each of the laser emitters consecutively for a predefined period of time; and
   a monitoring system optically coupled to an output of the optical multiplexer, wherein the monitoring system includes a photodetector for detecting a portion of the multiplexed optical signal, a filter for separating the monitoring signal, and a power monitor for monitoring a power level of the monitoring signal to determine if the one of the laser emitters outputting the modulated optical signal including the monitoring signal is emitting at the associated channel wavelength.

2. The multi-channel optical transmitter of claim 1 wherein the laser emitters include distributed feedback (DFB) lasers configured to emit light at the channel wavelengths associated with the DFB lasers, respectively.

3. The multi-channel optical transmitter of claim 1 wherein each of the laser emitters includes a Fabry-Perot (FP) laser for emitting light across a range of wavelengths including multiple channel wavelengths, and wherein the optical multiplexer is configured to filter the light from each of the FP lasers at the associated channel wavelength.

4. The multi-channel optical transmitter of claim 1 wherein each of the laser emitters includes a gain region for emitting light across a range of wavelengths including the channel wavelengths and a back reflector for reflecting light from the laser emitters, wherein the optical multiplexer is configured to filter light received on each of the input ports, respectively, at the different channel wavelengths and to provide the filtered light to the output port, and further including an exit reflector coupled to the output port of the optical multiplexer, the exit reflector being configured to reflect at least a portion of the filtered light back to the gain regions in the respective laser emitters such that lasing cavities are formed between the back reflectors of each of the laser emitters and the exit reflector and lasing occurs at each of the channel wavelengths reflected back to the respective gain regions of the respective laser emitters.

5. The multi-channel optical transmitter of claim 1 wherein the laser emitters include an array of Fabry-Perot (FP) gain chips, and further including an exit reflector at an output of the optical multiplexer, wherein external laser cavities are formed between the FP gain chips and the exit reflector, wherein the external laser cavities are configured to emit light at the channel wavelengths, respectively.

6. The multi-channel optical transmitter of claim 1 wherein the optical multiplexer is an arrayed waveguide grating (AWG).

7. The multi-channel optical transmitter of claim 1 wherein the laser emitters are tunable to one of the channel wavelengths, and further comprising a wavelength tuning system coupled to the monitoring system and to each of the laser emitters, the wavelength tuning system being configured to tune at least one of the laser emitters to one of the channel wavelengths in response to the power level of the monitoring signal obtained from the multiplexed optical signal.

8. The multi-channel optical transmitter of claim 7 wherein the wavelength tuning system includes a temperature control system configured to control a temperature of the laser emitters for tuning the laser emitters.

9. A method of monitoring a multiplexed laser array, the method comprising:
  modulating a plurality of channels of the multiplexed laser array with respective data signals and multiplexing to produce a multiplexed optical data signal at an output of the multiplexed laser array;
  consecutively modulating each of the channels of the multiplexed laser array for a predefined period of time with a monitoring signal to produce a monitoring optical signal together with the multiplexed optical data signal at the output the multiplexed laser array, wherein the monitoring signal has a lower amplitude and frequency than the data signals;
  tapping a portion of an optical output of the multiplexed laser array;
  detecting the portion of the optical output of the multiplexed laser array;
  filtering the detected portion of the optical output of the multiplexed laser array to obtain the monitoring signal; and
  determining a power of the monitoring signal to consecutively monitor each of the channels of the multiplexed laser array to determine if the one of the laser emitters outputting the modulated optical signal including the monitoring signal is emitting at the associated channel wavelength.

10. The method of claim 9 wherein the multiplexed laser array includes an arrayed waveguide grating (AWG) and a plurality of distributed feedback (DFB) lasers coupled to respective inputs of the AWG and configured to emit light at different channel wavelengths.

11. The method of claim 9 wherein the multiplexed laser array includes an arrayed waveguide grating (AWG), an array of Fabry-Perot (FP) gain chips coupled to respective inputs of the AWG, and an exit reflector at an output of the AWG, wherein external laser cavities are formed between back reflectors of the FP gain chips and the exit reflector, and wherein each of the external laser cavities is configured to emit light at a different channel wavelength.

12. The method of claim 9 further comprising tuning the at least one channel of the multiplexed laser array to a channel wavelength in response to the power of the monitoring signal at the output of the multiplexed laser array.

13. A multi-channel optical transceiver module comprising:
  a transceiver housing;
  a multi-channel receiver optical sub-assembly (ROSA) located in the transceiver housing, the ROSA being configured to receive a wavelength division multiplexed (WDM) optical signal on multiple channel wavelengths; and
  a multi-channel transmitter optical sub-assembly (TOSA) located in the transceiver housing, the TOSA being configured to transmit a wavelength division multiplexed (WDM) optical signal on multiple channel wavelengths, the TOSA comprising:
    a plurality of laser emitters having electrical inputs for receiving electrical signals including data signals and optical outputs for outputting modulated optical signals, wherein each of the laser emitters is associated with a channel and a channel wavelength;
    an optical multiplexer including a plurality of input ports optically coupled to the optical outputs of the laser emitters, respectively, the optical multiplexer being configured to receive the modulated optical signals from the laser emitters and to produce a multiplexed optical signal including the modulated optical signals at a plurality of different channel wavelengths, respectively;
    a monitoring signal generator coupled to the electrical inputs of the laser emitters, the monitoring signal generator being configured to generate a monitoring signal and to provide the monitoring signal to the electrical input of one of the laser emitters, wherein the monitoring signal generator is configured to provide the monitoring signal to each of the laser emitters consecutively for a predefined period of time; and
    a monitoring system optically coupled to an output of the optical multiplexer, wherein the monitoring system includes a photodetector for detecting a portion of the multiplexed optical signal, a filter for separating the monitoring signal, and a power monitor for monitoring a power level of the monitoring signal to determine if the one of the laser emitters outputting the modulated optical signal including the monitoring signal is emitting at the associated channel wavelength.

14. The multi-channel optical transceiver of claim 13 wherein the multiplexed laser array includes an arrayed waveguide grating (AWG) and a plurality of distributed feedback (DFB) lasers coupled to respective inputs of the AWG and configured to emit light at different channel wavelengths.

15. A wavelength division multiplexed (WDM) system comprising:
  a plurality of terminals configured to transmit and receive optical signals on multiple channel wavelengths, at least one of the plurality of terminals comprising:
    a plurality of laser emitters having electrical inputs for receiving electrical signals including data signals and optical outputs for outputting modulated optical signals, wherein each of the laser emitters is associated with a channel and a channel wavelength;
    an optical multiplexer including a plurality of input ports optically coupled to the optical outputs of the laser emitters, respectively, the optical multiplexer being configured to receive the modulated optical signals from the laser emitters and to produce a multiplexed optical signal including the modulated optical signals at a plurality of different channel wavelengths, respectively;

a monitoring signal generator coupled to the electrical inputs of the laser emitters, the monitoring signal generator being configured to generate a monitoring signal and to provide the monitoring signal to the electrical input of one of the laser emitters, wherein the monitoring signal generator is configured to provide the monitoring signal to each of the laser emitters consecutively for a predefined period of time; and a monitoring system optically coupled to an output of the optical multiplexer, wherein the monitoring system includes a photodetector for detecting a portion of the multiplexed optical signal, a filter for separating the monitoring signal, and a power monitor for monitoring a power level of the monitoring signal to determine if the one of the laser emitters outputting the modulated optical signal including the monitoring signal is emitting at the associated channel wavelength.

16. The WDM optical network of claim 15 wherein the at least one of the terminals includes an optical line terminal (OLT) in a WDM passive optical network (PON) and configured to transmit a WDM optical signal including a plurality of channel wavelengths, and wherein others of the plurality of terminals include optical networking terminals (ONTs) configured to receive optical signals at respective ones of the channel wavelengths in the WDM-PON.

* * * * *